United States Patent
Zhang

[19]

[11] Patent Number: 5,835,396
[45] Date of Patent: Nov. 10, 1998

[54] THREE-DIMENSIONAL READ-ONLY MEMORY

[76] Inventor: Guobiao Zhang, P.O. Box 9562, Berkeley, Calif. 94709-0562

[21] Appl. No.: 732,902

[22] Filed: Oct. 17, 1996

Related U.S. Application Data

[60] Provisional application No. 60/020,941 Jul. 1, 1996.

[51] Int. Cl.⁶ ..................................................... G11C 5/02
[52] U.S. Cl. .................................. 365/51; 365/63; 365/94
[58] Field of Search .................................. 365/51, 63, 94, 365/96

[56] References Cited

U.S. PATENT DOCUMENTS

| | | | |
|---|---|---|---|
| 4,162,538 | 7/1979 | Thornburg | 365/96 |
| 4,442,507 | 4/1984 | Roesner | 365/100 |
| 4,525,921 | 7/1985 | Carson et al. | 29/577 C |
| 4,646,128 | 2/1987 | Carson et al. | 357/74 |
| 4,899,205 | 2/1990 | Hamdy | 357/51 |
| 5,051,865 | 9/1991 | Kato | 361/386 |
| 5,075,253 | 12/1991 | Sliwa | 437/209 |
| 5,131,091 | 7/1992 | Mizuta | 395/725 |
| 5,313,096 | 5/1994 | Eide | 257/686 |
| 5,331,591 | 7/1994 | Clifton | 365/51 |
| 5,429,968 | 7/1995 | Koyama | 437/48 |
| 5,432,729 | 7/1995 | Carson et al. | 365/51 |
| 5,561,622 | 10/1996 | Bertin et al. | 365/51 |
| 5,648,684 | 7/1997 | Bertin et al. | 257/685 |
| 5,656,553 | 8/1997 | Leas et al. | 438/15 |

OTHER PUBLICATIONS

J. Shackelford, "Introduction of Materials Science for Engineers", 2nd ed., pp. 609–610.

*Primary Examiner*—David C. Nelms
*Assistant Examiner*—Michael T. Tran

[57] ABSTRACT

A read-only memory structure, having a three dimensional arrangement of memory elements, is disclosed. The memory elements are partitioned into multiple memory levels. Each memory level is stacked on top of another. Within each memory level, there are a plurality of memory elements and address select lines. The memory elements can be either mask programmable or electrical programmable.

20 Claims, 15 Drawing Sheets

THREE-DIMENSIONAL READ-ONLY MEMORY

This patent application relates to a provisional patent application, "A Three-Dimensional Read-Only Memory", provisional patent No. 60/020,941, filed on Jul. 1, 1996.

BACKGROUND

1. Technical Field of the Invention

The present invention relates to the field of integrated circuit, and more particularly to read-only memory (ROM).

2. Prior Arts

Read-only memory (ROM) refers to those types of memories into which data normally is written during fabrication or can be written only once. The prior art ROM is arranged in a two-dimensional rectangular matrix on a semiconductor substrate. At each cross-point of the matrix, a coupling mechanism exists. The coupling may include resistive, capacitive, inductive, diode, or active device elements and it represents one bit of digital information. In the meantime, each coupling is connected with output by electrical means and this guarantees a short access time. ROM can be categorized into two classes: mask programmable ROM (MPROM), and electrically programmable ROM (EPROM). In MPROM, digital information is defined by masks during manufacturing, while in EPROM, information can be configured by end users.

Examples of MPROM are given by U.S. Pat. No. 5,429,968 issued to Koyama on Jul. 4, 1995. It discloses a MPROM using MOS transistors with different threshold voltage. Implantation at a selected site makes MOS transistor at said site enhancement-mode or depletion-mode. Because of the difference in their threshold voltage, transistors at various sites can be used to represent different digital information. Since transistors have to be built on a semiconductor substrate, this MPROM structure can only be arranged in a two-dimensional array.

On the other hand, EPROMs generally use resistive coupling to represent digital data. Typical resistive coupling elements include fuses and antifuses. U.S. Pat. No. 4,899,205, issued to Hamdy, et al on Feb. 6, 1990, describes a method to form a two-dimensional EPROM using silicon-to-silicon antifuses as programmable elements. In this structure, antifuse is integrated with a source/drain junction of the access transistor. Since access transistors have to be built on a semiconductor substrate, EPROM using silicon-to-silicon antifuses can only be configured into a two-dimensional matrix and the maximum information that can be stored on the unit area of semiconductor chip is limited by the size of the access transistors. U.S. Pat. No. 4,442,507, issued to Roesner on Apr. 10, 1984, discloses an electrically programmable read-only memory using stacked Schottky diodes as memory elements. One address select line is formed by polycrystalline silicon whereas the other address select line is made of aluminum. During manufacturing process, polycrystalline silicon is deposited at the temperature of about 600° C. Because the maximum temperature aluminum can stand is 450° C., no polycrystalline silicon can be deposited with aluminum underneath. As a result, only one layer of EPROM structure can be manufactured. Accordingly, memory density is limited.

The prior arts used memory structures arranged in a two-dimensional array and therefore the memory density is limited. To increase the memory density, a three-dimensional ROM (3D-ROM) structure is disclosed in the present invention.

OBJECTS AND ADVANTAGES

It is a principle object of the present invention to provide a read-only memory with high memory density.

It is a further object of the present invention to provide a read-only memory with fast access time.

It is a further object of the present invention to provide a read-only memory which can be manufactured with the state-of-the-art semiconductor processing techniques.

It is a further object of the present invention to provide a mask programmable read-only memory which can be configured during the backend processing.

It is a further object of the present invention to provide a electrical programmable read-only memory which can be configured by end users.

In accordance with these and other objects of the present invention, new read-only memory structure is disclosed. This memory structure arranged the memory elements into three dimensions.

SUMMARY OF THE INVENTION

A read-only memory structure, having a three dimensional arrangement of memory elements, is disclosed. The three-dimensional read-only memory is formed on a semiconductor substrate. Transistors are built on this semiconductor substrate using standard technology. These transistors provide means to select/program/read a certain memory element from a signal originating at input/output pads of the completed circuit. Each memory element provides a coupling mechanism between two address select lines—a word line and a bit line. The memory elements are partitioned into multiple memory levels. Each memory level is stacked on top of another. Within each memory level, there are a plurarity of memory elements and address select lines.

Because the memory levels are stacked on top of each other, the underlying memory level should provide a good foundation upon which the next memory level can be built. With the advent of chemical mechanical polishing (CMP) technique, this task can be easily accomplished. An insulating dielectric is first disposed over the first memory level and fill the gaps. Then a CMP step globally planarizes the wafer surface. Thus, the second memory level can be easily built on this flat surface. After the completion of the second memory level, another CMP step will be performed to planarize the wafer surface. Repeating the forgoing steps, a three-dimensional read-only memory can be easily manufactured.

DETAILED DESCRIPTION OF THE PREFERRED EMBODIMENT

Those of ordinary skills in the art will realize that the following description of the present invention is illustrative only and is not intended to be in any way limiting. Other embodiments of the invention will readily suggest themselves to such skilled persons from an examination of the within disclosure.

Figure 1:
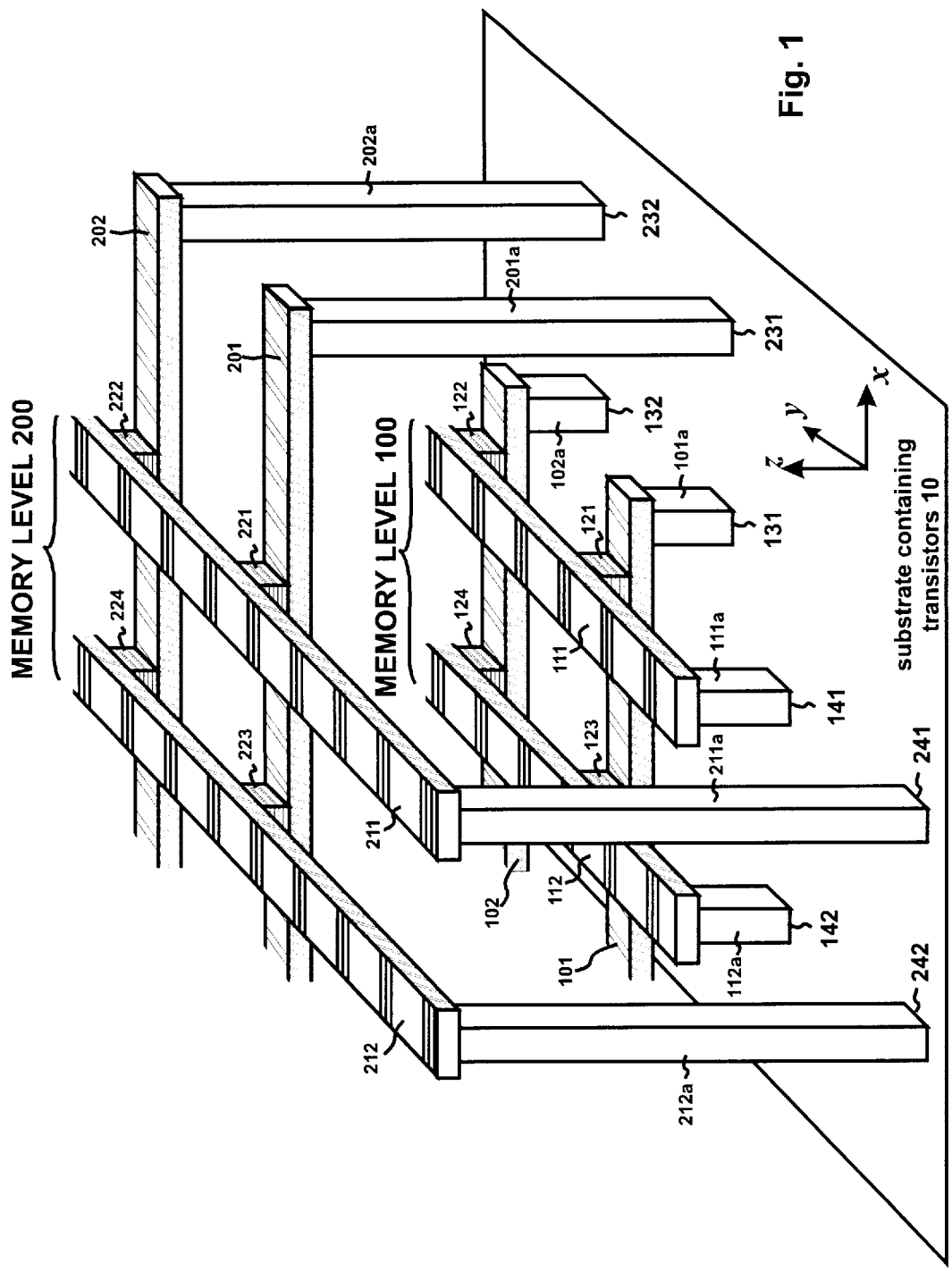
FIG. 1 is a perspective view of a preferred embodiment of 3D-ROM with two memory levels.

Referring to FIG. 1, a preferred embodiment of a 2×2×2 3D-ROM is disclosed. Here, a l×m×n 3D-ROM refers to a 3D-ROM with l number of memory levels, m number of word lines and n number of bit lines. This 3D-ROM is built on a semiconductor substrate 10. It has two memory levels 100, 200. Each memory level is laid down parallel to the substrate 10, i.e. the x-y plane The memory level 200 is stacked on top of the memory level 100, i.e. along the z direction. Each memory level comprises an array of 2×2 memory elements, two address select lines along x direction and two address select lines along y direction. The address lines along the x direction are referred as word lines. They include word lines 101, 102 at the memory level 100 and word lines 201, 202 at the memory level 200. The address select lines along they direction are referred as bit lines. They include bit lines 111, 112 at the memory level 100 and bit lines 211, 212 at the memory level 200. Memory elements 121–124, 221–224 are two terminal devices and provide a coupling mechanism between word lines and the bit lines. The coupling mechanism includes resistive, capacitive, inductive, diode, or active device elements. By varying the magnitude of the coupling, each memory element represents a bit of binary information. The address select lines provide programming/read path for the selected memory elements.

FIG. 1 also illustrates the connections between substrate 10 and the address select lines at various memory levels. At the memory level 100, the word lines 101, 102 make contacts with the substrate 10 through contact vias 101a, 102a at contact points 131, 132 whereas the bit lines 111, 112 make contacts with the substrate 10 through contact vias 111a, 112a at contact points 141 and 142. Similarly, at the memory level 200, the word lines 201, 202 make contacts with the substrate 10 through contact vias 201a, 202a at contact points 231, 232 whereas the bit lines 211, 212 make contacts with the substrate 10 through contact vias 211a, 212a at contact points 241 and 242. To make contacts from the memory level 200 to the substrate 10, an extension the of address select lines is required. For example, the bit line 211 has to be extended beyond the contact via 111a so that the contact via 211a would not inadvertently damage the bit line 111 or the contact via 111a.

Figure 2:
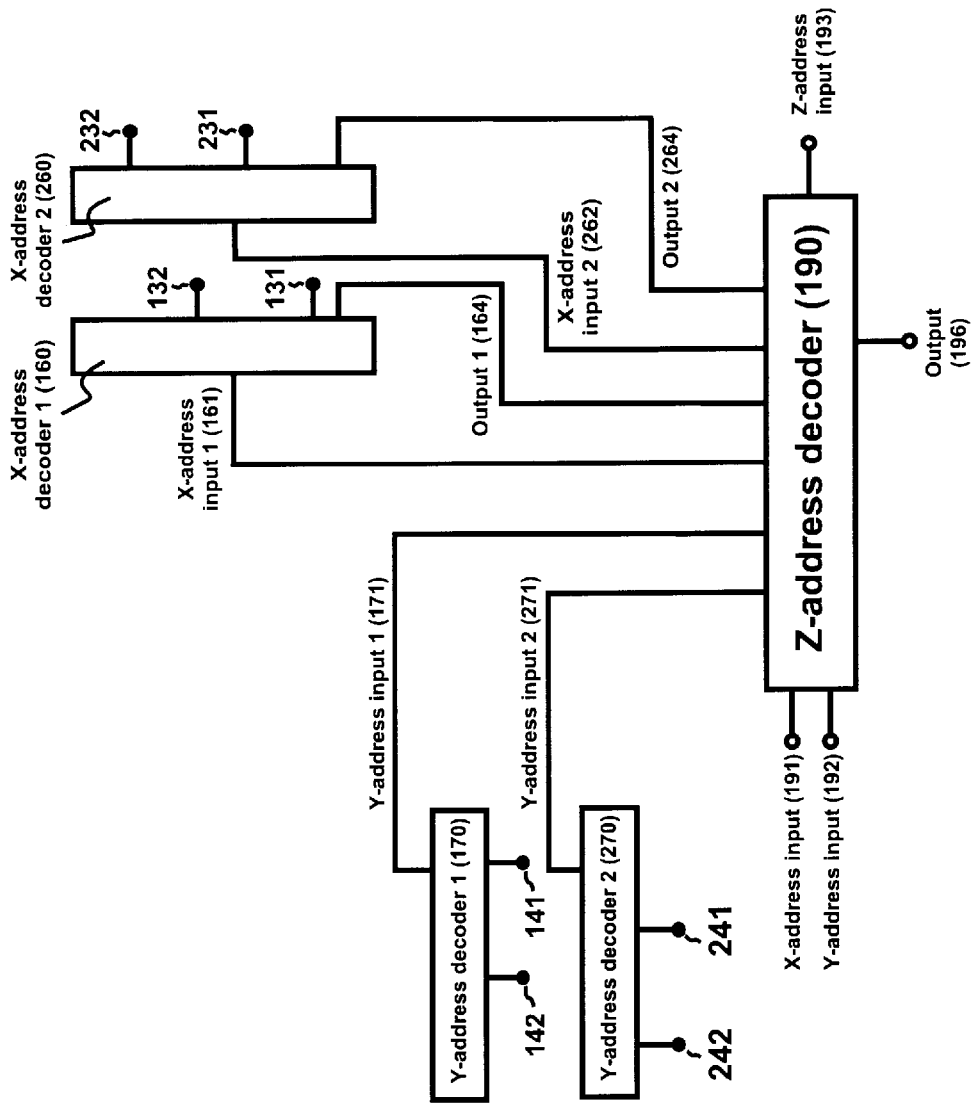
FIG. 2 is a circuit diagram showing circuitry on substrate. It provides addressing and read functions for a 3D-MPROM chip.

Referring now to FIG. 2, an addressing/read circuit diagram is shown for a 2×2×2 3D-MPROM. Because transistors are used to perform these functions, this addressing/read circuit is built on the semiconductor substrate 10. It comprises a Z-address decoder 190, two X-address decoders 160, 260, two Y-address decoders 170, 270. The Z-address decoder 190 comprises a X-address input 191, a Y-address input 192 and a Z-address input 193, which are connected with input pins on the semiconductor package containing the memory.

To address/read the information stored in a memory element, e.g. memory element 121 of FIG. 1, appropriate voltages are applied to X-, Y-, and Z-address inputs 191, 192 and 193. The voltage level at the Z-address input 193 enables two electrical connections. One is between the X-address input 191 and the X-address input 1 (161), and the other is between the Y-address inputs 192 and the Y-address input 1 (171). Hence, the address signals on X-address input 191 and Y-address input 192 are directed to X-address decoder 1 (160) and Y-address decoder 1 (170). Accordingly, only the voltage level of the address select lines at the memory level 100 can be shifted. The voltage level at the Z-address input 193 also enables electrical connection between the output 1 (164) at the X-address decoder 1 (160) and the output 196 at the Z-address decoder 190.

The address signal at the X-address decoder 1 (160) raises the voltage at the contact point 131 to half of the read voltage, $V_R/2$. In the meantime, the address signal at the Y-address decoder 1 (170) lowers the voltage at the contact point 141 to negative half of the read voltage, $-V_R/2$. Through the contact vias 101a and 111a, the voltage level of the word line 101 is raised to $V_R/2$, and the voltage level of the bit line 111 is lowered to $-V_R/2$ with all other address select lines floating. As a result, a read voltage $V_R$ is applied across the two terminals of the memory element 121. For different logic state at the memory element 121, different current can be sensed at the word line 101. The output signal is directed from the output 1 (164) to the output 196, and then to the output pin. Thus, the information stored in the memory element 121 is read.

Figure 3:
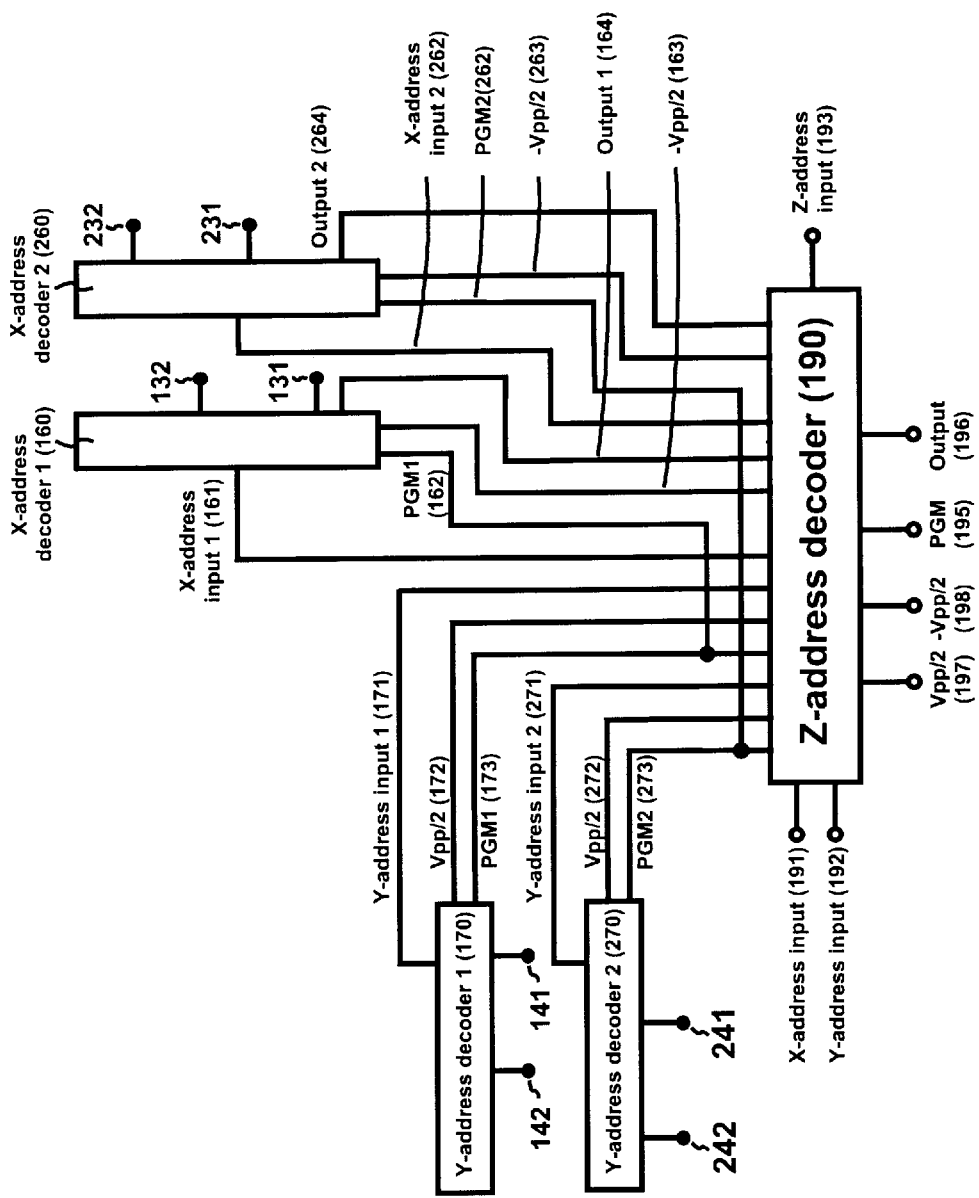
FIG. 3 is a circuit diagram showing circuitry on substrate. It provides addressing, programming and read functions for a 3D-EPROM chip.

Referring now to FIG. 3, an addressing/read/programming circuit diagram is illustrated for a 2×2×2 3D-EPROM. Similarly, this circuit is built on the semiconductor substrate 10. It also comprises a Z-address decoder 190, two X-address decoders 160, 260, two Y-address decoders 170, 270. Besides the X-, Y-, and Z-address inputs 191, 192 and 193, the Z-address decoder 190 comprises an output 196, a program-enable PGM 195, a voltage supply of half of the programming voltage $V_p/2$ 197 and a voltage supply of negative half of the programming voltage $-V_p/2$ 198.

The read operation is similar to that of the 3D-MPROM. The programming of a 3D-EPROM can be performed in the following manner. For example, to program memory element 224 of FIG. 1, Z-address input 193 enables X-address input 191, Y-address input 192, $V_p/2$ 197, $-V_p/2$ 198 and PGM 195 to be connected with their counterparts at X-address decoder 2 (260) and Y-address decoder 2 (270). Then a unique combination of X- and Y-address signals select the word line 202 and the bit line 212 through contact points 232, 242. With PGM 195 activated, the voltage on the word line 202 is raised to $V_p/2$ and the voltage on the bit line 212 is lowered to $-V_p/2$. In the meantime, the voltage level of all other address select lines are grounded. Located at the intersection of the word line 202 and the bit line 212, the memory element 224 is subjected to a programming voltage of $V_p$. As a result, the memory element 224 is programmed. On the other hand, the maximum voltage which other memory elements are subjected to is only $V_p/2$ and therefore, they stay at their unprogrammed state.

Figure 4:
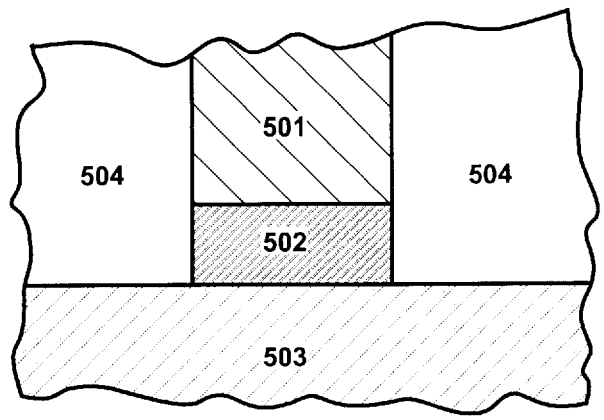
FIG. 4 is a cross-sectional view of a typical 3D-ROM memory element.

FIG. 4 illustrates the cross-sectional view of a typical 3D-ROM memory element. It comprises a top electrode 501, a ROM layer 502, a bottom electrode 503 and a field region 504. The top electrode 501 functions as an address select line such as a bit line. It comprises metallic materials. Here, metallic materials refer to elemental metals, metal alloys and metal compounds. Some examples are aluminum or copper, with a thickness of 0.2–2 µm, preferably 0.5 µm. At the interface between the top electrode 501 and the ROM layer 502, there can be a layer of barrier metal, such as TiW. This barrier layer prevents any reaction between the top electrode 501 and the ROM layer 502. The bottom electrode 503 functions as another address select line such as a word line. Similarly, it is comprised of metallic materials such as aluminum or copper, with a thickness of 0.2–2 µm, preferably 0.5 µm. At the interface between the bottom electrode 503 and the ROM layer 502, there might exist a barrier layer made of materials such as TiW. It can prevent the reaction between the bottom electrode 503 and the ROM layer 502.

Figure 7:
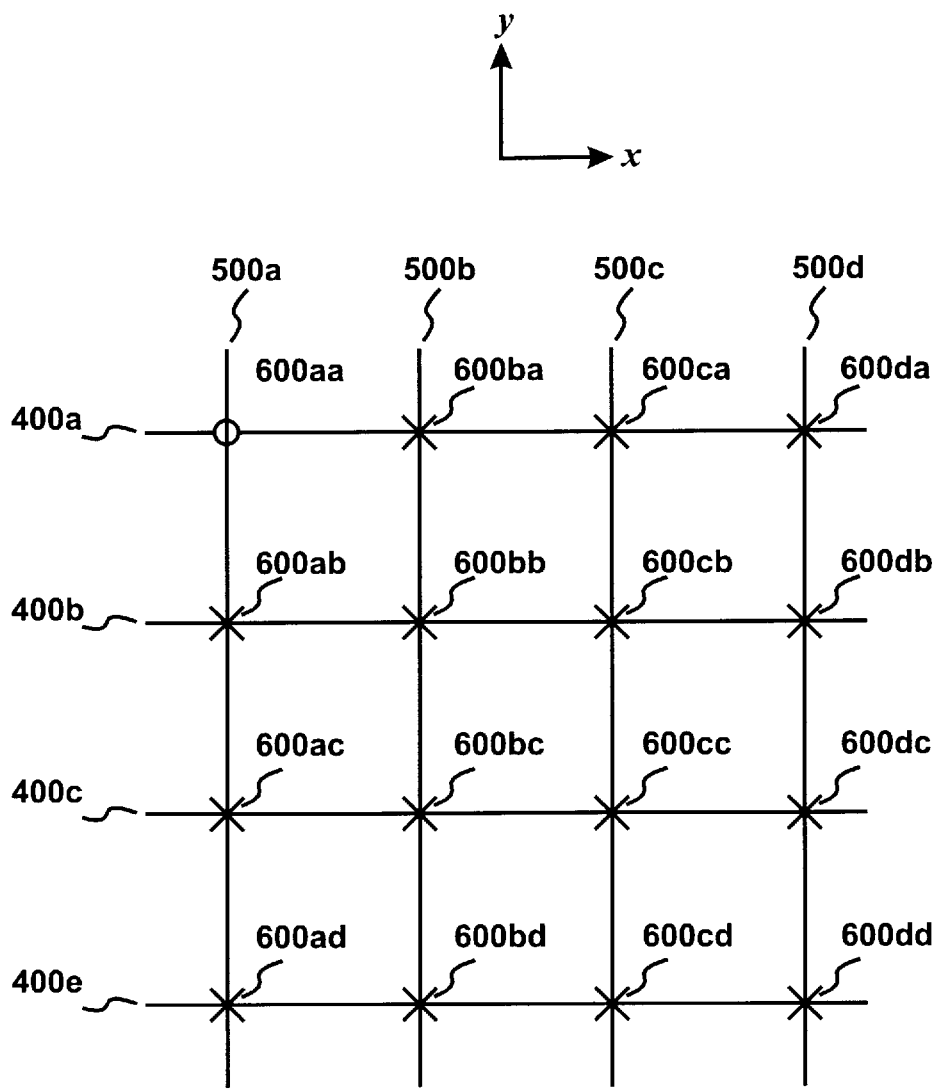
FIG. 7 illustrates a 4×4 memory array during a worst-case read condition. The circle represents a digital "0" and the crosses represent digital "1"
Figure 8:
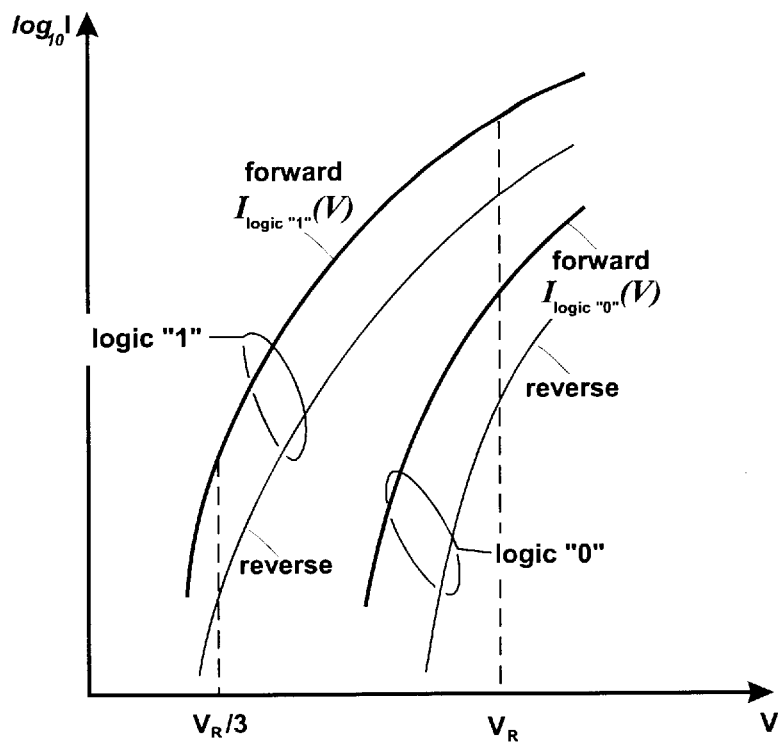
FIG. 8 illustrates the current-voltage (IV) characteristics of logic "0" and logic "1" of the MPROM layer in 3D-MPROM.

The ROM layer 502 represents the digital information stored in this memory element. In the case of MPROM, the ROM layer is referred as MPROM layer. When the MPROM layer is a high resistance current path at the read voltage, this memory element represents a logic "0". Accordingly, the MPROM layer for logic "0" element is referred as a blocking layer. On the other hand, when the MPROM layer is a low resistance current path at the read voltage, this memory element represents a logic "1". Accordingly, the MPROM layer for logic "1" element is referred as a quasi-conduction layer. The reason to use the term "quasi-conduction layer" will become apparent as FIGS. 7 and 8 are described in details.

In the case of EPROM, the ROM layer is referred as EPROM layer. The EPROM layer comprises a quasi-conduction layer and an antifuse layer. The quasi-conduction layer has the same property as that in 3D-MPROM. The antifuse layer is in a high resistance state before programming. It irreversibly changes to low resistance after programming. For a fresh EPROM element, the antifuse layer is intact. Hence, the EPROM layer is in a high resistance state and represents a logic "0". After programming, the antifuse layer becomes a resistor. Accordingly, the EPROM layer behaves like a quasi-conduction layer and represents a logic "1".

Different memory elements are separated from each other by the field region 504. The field region 504 comprises an insulating material such as silicon oxide, with a thickness of 0.2–2 µm, preferably 0.5 µm.

Figure 5A:
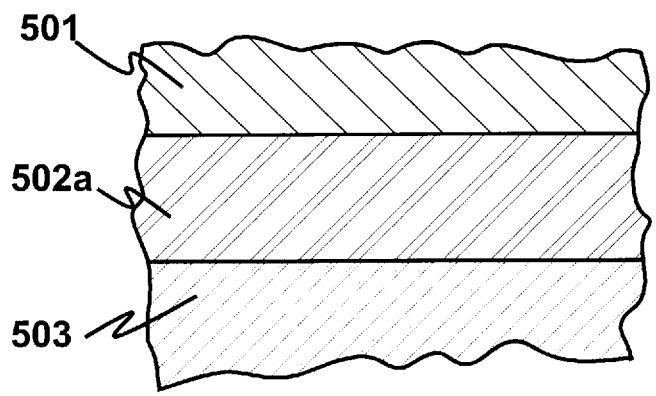
FIGS. 5A–5C illustrate cross-sectional views of several preferred MPROM layer.
Figure 5B:
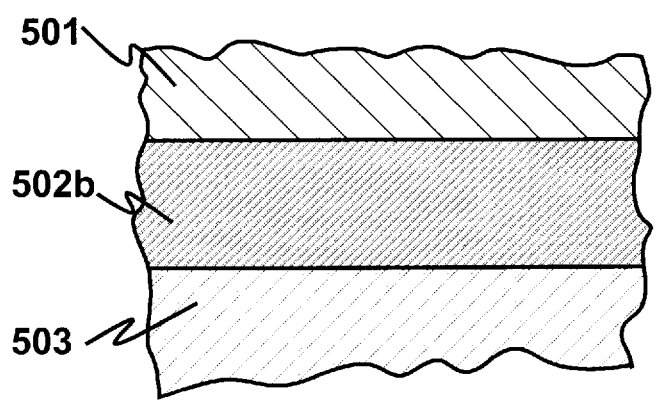
Figure 5C:
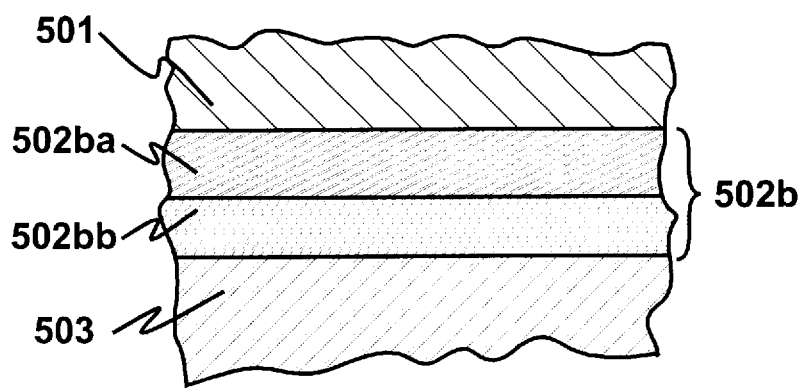

FIGS. 5A–5C illustrate several preferred MPROM layer. The MPORM layer 502a in FIG. 5A is suitable for the logic "0" element of 3D-MPROM. The MPROM layers in FIGS. 5B and 5C are suitable for the logic "1" element of 3D-MPROM.

FIG. 5A illustrates a preferred MPROM layer suitable for the logic "0" element of 3D-MPROM. This preferred MPROM layer comprises a blocking insulating dielectric 502a. An example of the blocking insulating dielectric 502a is silicon oxide deposited using plasma enhanced CVD methods. It has a thickness between 20 nm–2 µm, preferably 0.5 µm.

FIGS. 5B and 5C illustrate preferred MPROM layers suitable for the logic "1" element of the 3D-PROM. These MPROM layers comprise a quasi-conduction layer and behaves like a nonlinear resistor. It should have the following properties: a) it provides a low resistance current path when subjected to the read voltage; b) when the applied voltage has a magnitude smaller than or polarity opposite to that of the read voltage, the resistance becomes substantially larger. The reason for this will become apparent as FIGS. 7 and 8 are described in details.

FIG. 5B illustrates a preferred quasi-conduction layer 502b for the logic "1" element. It could comprise amorphous silicon, with a thickness between 5 nm and 500 nm, preferably 100 nm. This amorphous silicon layer can be deposited using methods such as sputtering, glow discharge. If the address select lines are only made of refractory metals, a higher thermal budget can be tolerated and therefore polycrystalline silicon can be used. The amorphous silicon layer 502b can be either intrinsic or doped. For the intrinsic amorphous silicon, it can be deposited at a temperature higher than 200° C. to ensure less hydrogen in amorphous silicon. As a result, the amorphous silicon can conduct more current and the access time gets shorter. Because of its exponential current-voltage (IV) characteristic, amorphous silicon can generally satisfy the above requirements. On the other hand, protective ceramic materials, especially protective oxide, also have an exponential IV characteristic and therefore can be used for the quasi-conduction layer 502b. Here, protective ceramic materials refer to ceramic materials whose Pilling-Bedworth ratio is larger than 1 (J. Shackelford, *Introduction to Materials Science for Engineers*, 2nd ed. pp. 609–610). Examples of protective metal oxides are the oxides of Be, Cu, Al, Cr, Mn, Fe, Co, Ni, Pd, Pb, Ce, Sc, Zn, Zr, La, Y, Nb, Rh and Pt. The methods to form protective ceramic materials include: 1) depositing means, e.g. chemical vapor deposition (CVD) and sputtering; and 2) growing means, such as thermal oxidation, plasma oxidation and anodization (G. Zhang, patent application, "Applications of Protective Ceramics"). The thickness of the protective ceramic materials ranges from 2 nm to 200 nm, preferably around 10 nm. Other candidates for the quasi-conduction layer 502b are amorphous germanium, carbon, silicon carbide, etc.

FIG. 5C illustrates an alternate preferred quasi-conduction layer 502b for the logic "1" element. It comprises an amorphous silicon p-n diode. Similarly, polycrystalline silicon p-n diode can be used if the address select lines are only made of refractory metals. The thickness of p-layer 502bb and n-layer 502ba can range from 20 nm to 300 nm, preferable 60 nm. Resistance through a p-n diode differs substantially along opposite polarities. Thus, a p-n diode can satisfy the above requirements and is suitable for the logic "1" element. Besides p-n diode, p-i-n junction is also feasible as the quasi-conduction layer 502b. The benefit of using p-n or p-i-n junction as the quasi-conduction layer 502b will become apparent as FIGS. 7 and 8 are discussed.

Figure 6A:
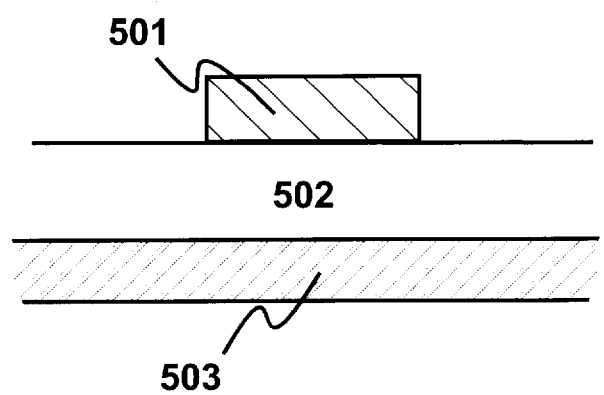
FIGS. 6A–6E illustrate cross-sectional views of several preferred 3D-MPROM element structure.

FIGS. 6A–6E illustrate several preferred memory element structures for 3D-MPROM. Of these figures, FIG. 6A is an ideal candidate for the logic "0" element. Structures in FIGS. 6B–6E can be used for either the logic "1" or logic "0" element, preferably for the logic "1" element.

FIG. 6A illustrates a cross-sectional view of a first preferred memory element. This preferred embodiment is suitable for the logic "0" element. Accordingly, the MPROM layer 502 is the blocking layer 502a. This blocking layer could be an extension of the field region 504 and is made of a thick insulating material such as field oxide. It blocks the current flow between the top and bottom electrodes 501, 503. As a result, the resistance is high between the top electrode 501 and the bottom electrode 503.

FIGS. 6B–6E illustrate the cross-sectional structural views of four preferred memory elements for 3D-MPROM. They have similar structures as metal-to-metal antifuses. A via 505 is formed in the field region 504 and the MPROM layer 502 is laid down in, under or on top of the via 505. Depending on the logic state of this memory element, the MPROM layer 502 can be a blocking layer for the logic "0" element, or a quasi-conduction layer for the logic "1" element.

Figure 6B:
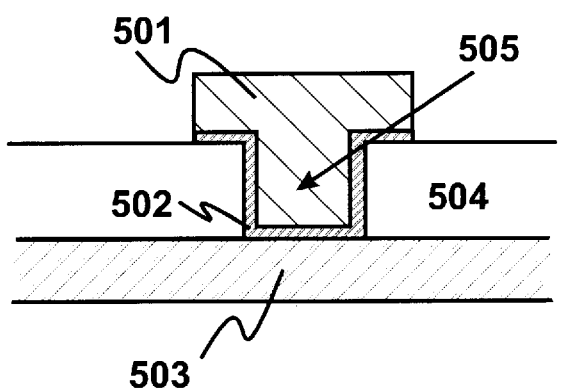

FIG. 6B illustrates a preferred memory element for 3D-MPROM. In this preferred embodiment, the MPROM layer 502 is inside the via 505. To fabricate this particular memory element, the bottom electrode 503 is first deposited and etched. Then a field layer 504 is deposited and a via 505 is etched. Next, the MPROM layer 502 is deposited in the via 505 before the top electrode 501 is deposited. Finally, the top electrode 501 and the MPROM layer 502 are masked and etched.

Figure 6C:
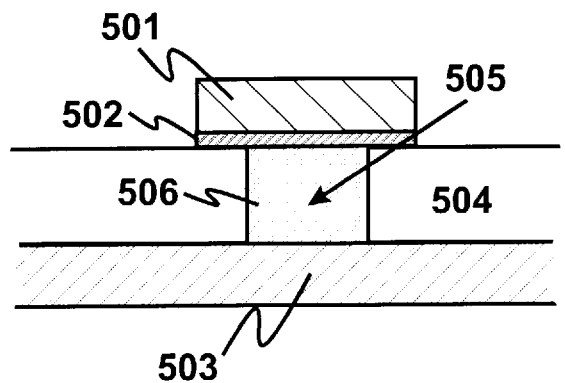

FIG. 6C illustrates an alternate preferred memory element for 3D-MPROM. This preferred embodiment places the MPROM layer 502 on top of the via 505. Typical fabrication steps include: forming the bottom electrode 503; depositing the field material 504 and etching a via 505 therethrough; filling the via 505 with a plug 506 such as W; planarizing W with the surrounding field material 504; depositing and defining the MPROM layer 502 and the top electrode 501.

Figure 6D:
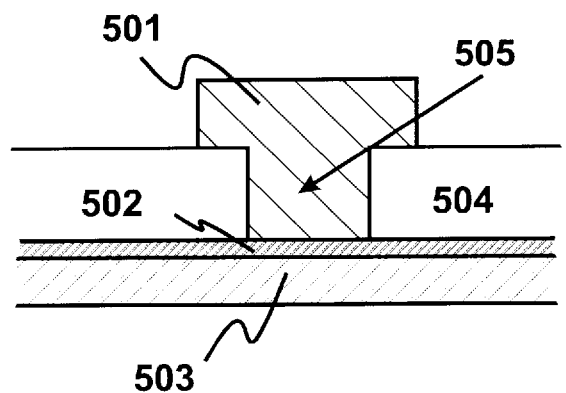

FIG. 6D illustrates an alternate preferred memory element for 3D-MPROM. In this preferred embodiment, the MPROM layer 502 is under the via 505. It is fabricated through the steps of: depositing the bottom electrode 503 and the MPROM layer 502; depositing the field material 504 and etching a via 505 which exposes the top surface of the MPROM layer 502; depositing and patterning the top electrode 501.

Figure 6E:
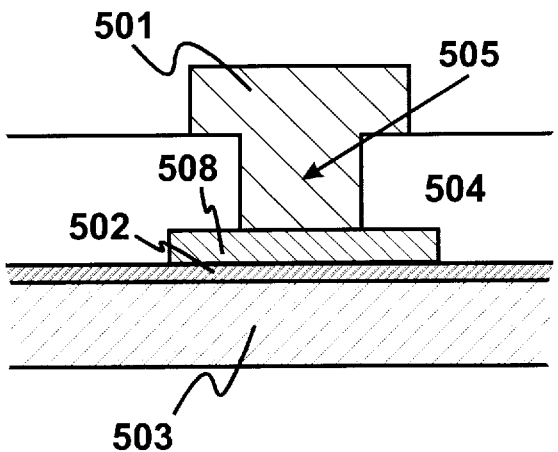

FIG. 6E illustrates an alternate preferred memory element for 3D-MPROM. This preferred embodiment differs from the previous embodiment by inserting a top buffer layer 508 between the MPROM layer 502 and the top electrode 501. The top buffer layer 508 is made of conductors such as W, with a thickness of 50 nm–500 nm, preferably 100 nm. It prevents any overetch to the MPROM layer 502 during the opening of the via 505.

FIG. 7 shows a worst-case read operation for a n×n memory array. The memory element to be read is element 600aa and it is in logic "0" state. All other memory elements are in logic "1" state. During read, the voltage on the word line 400a is raised to $V_R/2$, the voltage on the bit line 500a is lowered to $-V_R/2$. All other address select lines are floating. The current-voltage (IV) characteristic of the logic "0" and logic "1" elements are shown in FIG. 8. The forward and reverse IV has a nonlinear dependence on the applied voltage for both the logic "0" and logic "1" elements. The magnitude of the reverse current is smaller than or comparable to that of the forward current. The benefit of this IV characteristic is shown below.

When reading the memory element 600aa (a logic "0"), the voltage on the word line 400a is raised to half of the read voltage $V_R/2$, whereas the voltage on the bit line 500a is lowered to the negative half of the read voltage $-V_R/2$. Thus, current conduction through the memory element 600aa contributes a $I_{600aa}$ $$I_{600aa} = I_{logic\,"0"}(V_R)$$

to the current flow in the word line 400a. The additional current in the word line 400a comes from routes such as 600ab→600bb→600ba. If a single layer of amorphous silicon is used as the quasi-conduction layer 502b, the reverse IV characteristic would be similar to that under the forward bias. Under such a circumstance, the voltage drop across each logic "1" element, e.g. 600ab, 600bb and 600ba, is about one third of the read voltage. As a result, the leakage current through the route 600ab→600bb→600ba is about $I_{logic\,"1"}(V_R/3)$. Because there are n×n memory elements at this memory level, for the worst case, there are n leakage paths like 600ab→600bb→600ba. So the worst-case additional current is about $$I_{additional} = I_{logic\,"1"}(V_R/3) \times n.$$

In sum, the worst-case current flow in the word line 400a for a logic "0" is $$I_{word\ line\ for\ logic\ "0"} = I_{600aa} + I_{additional} = I_{logic\,"0"}(V_R) + I_{logic\,"1"}(V_R/3) \times n.$$

On the other hand, the worst-case current flow in a word line for a logic "1" is $$I_{word\ line\ for\ logic\ "1"} = I_{logic\,"1"}(V_R).$$

This corresponds to the situation where only the memory element of interest is in the logic "1" state, whereas all others are in the logic "0" state and could contribute very little to the word line current.

In order to distinguish a logic "0" from a logic "1", it is desired to have $$I_{word\ line\ for\ logic\ "1"} > I_{word\ line\ for\ logic\ "0"},$$

or, $$I_{logic\,"1"}(V_R) > I_{logic\,"0"}(V_R) + I_{logic\,"1"}(V_R/3) \times n.$$

In general, $I_{logic\,"0"}(V_R) \ll I_{logic\,"1"}(V_R)$. Thus, $$n < \frac{I_{logic\,"1"}(V_R)}{I_{logic\,"1"}\left(\frac{V_R}{3}\right)}. \quad \text{Eq. (1)}$$

Since the memory capacity at one memory level is $n^2$, Eq. (1) sets an upper limit on the memory capacity at a single memory level.

From Eq. (1), the memory capacity depends on the nonlinearity of the IV characteristic of the quasi-conduction layer. If the quasi-conduction layer has an exponential IV characteristic, the ROM could have a large capacity. For example, the current at 12V for a 9.2 nm silicon oxide is about $10^6$ larger than the current flow at 4V. Thus, the maximum memory capacity could reach $10^{12}$ at a single memory level.

If an amorphous silicon p-n diode is used as the quasi-conduction layer, the voltage applied on one of the memory elements along the additional current path is reverse biased, e.g. the voltage polarity on the memory element 600bb. The worst-case additional current when reading a logic "0" would be much less. Accordingly, the memory capacity could be even larger.

Figure 9A:
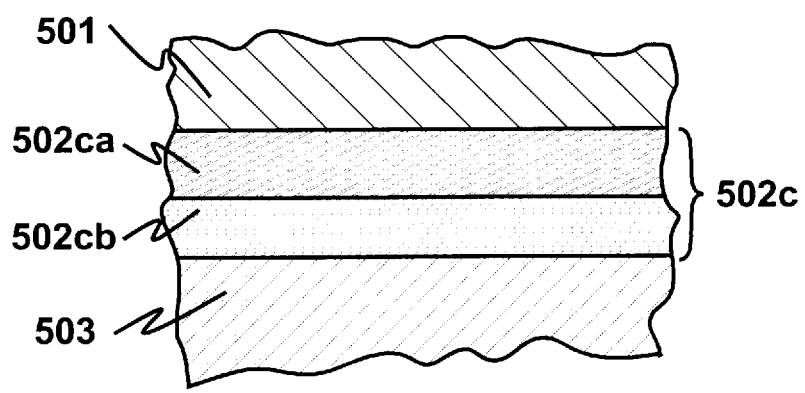
FIG. 9A illustrates a detailed cross-sectional view of a first preferred EPROM layer.

FIGS. 9A–11 are related to 3D-EPROM. Unlike 3D-MPROM, the memory elements of 3D-EPROM have the same physical structure. All memory elements are originally in the logic "0" state, or unprogrammed state. The end user can selectively program memory element at desired location and switch it to the logic "1" state. Accordingly, the EPROM layer comprises a quasi-conduction layer and an antifuse layer. The quasi-conduction layer has the same structure and function as that used in the logic "1" element for 3D-MPROM. The antifuse layer, on the other hand, has a high resistance at the unprogrammed state and switches to a low resistance state after being programmed. FIGS. 9A–9C illustrate some examples.

Figure 11:
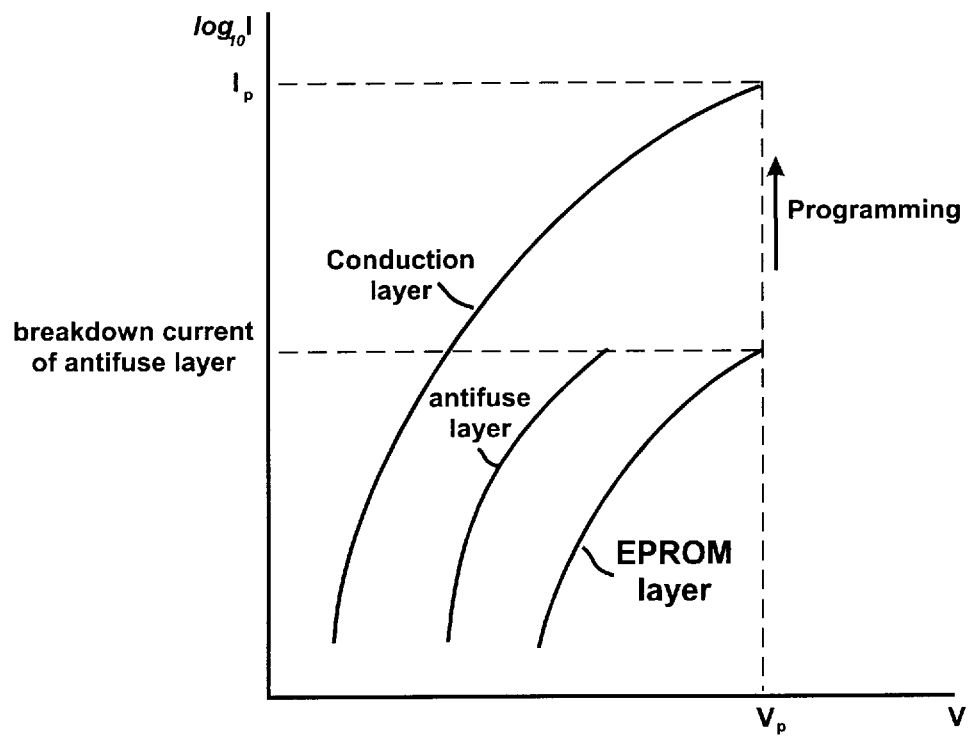
FIG. 11 illustrates the IV characteristics of the quasi-conduction layer, antifuse layer and EPROM layer.

FIG. 9A illustrates a first preferred EPROM layer 502c of a 3D-EPROM memory element. It comprises a quasi-conduction layer 502cb and an antifuse layer 502ca. The quasi-conduction layer 502cb is similar to that used in 3D-MPROM and can have similar material structure to those illustrated in FIG. 5B. The antifuse layer 502ca is a thin layer of amorphous silicon or protective ceramic. For example, the antifuse layer can be made of chromium oxide, with a thickness of 3 nm–100 nm, preferably 10 nm. FIG. 11 illustrates the IV characteristics of the quasi-conduction layer 502cb, the antifuse layer 502ca and the unprogrammed EPROM layer 502c. During programming, the antifuse layer 502ca breaks down under a programming voltage $V_p$ and a programming current $I_p$. $V_p$ and $I_p$ are chosen in such a way that they cause no damage to the quasi-conduction layer 502cb. After programming, the antifuse layer 502ca switches to a low resistance state. Thus, the IV characteristic of the programmed EPROM layer is very close to that of the quasi-conduction layer 502cb. This programmed state represents a logic "1".

Figure 9B:
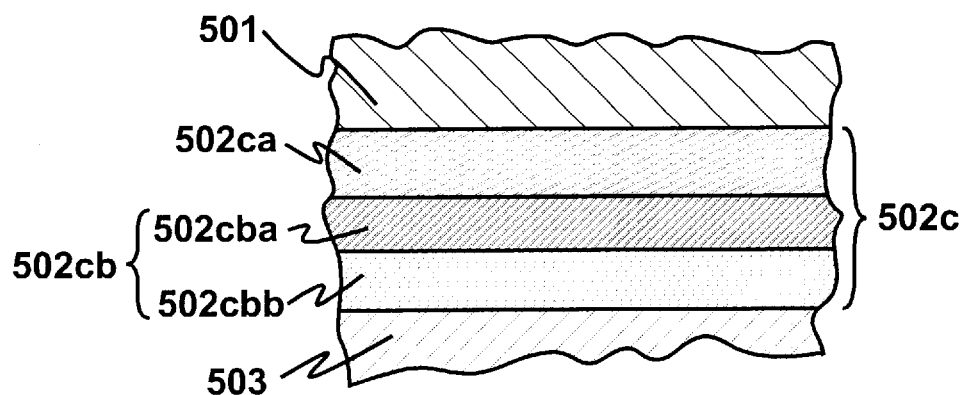
FIG. 9b illustrates a detailed cross-sectional view of a second preferred EPROM layer.

FIG. 9B illustrates a second preferred EPROM layer 502c of a 3D-EPROM memory element. In this preferred embodiment, the quasi-conduction layer 502c comprises a p-n diode 502cb and an antifuse layer 502ca. The p-n diode 502cb is similar to that illustrated in FIG. 5C. It is made of a p-doped silicon region 502cbb and an n-doped silicon region 502cba, each with a thickness of 50 nm–500 nm, preferably 60 nm. The antifuse layer 502ca can be placed under or on top of the quasi-conduction layer. The operation of this preferred embodiment is similar to that in FIG. 9A, except that the p-n diode has a better conduction properties.

Figure 9C:
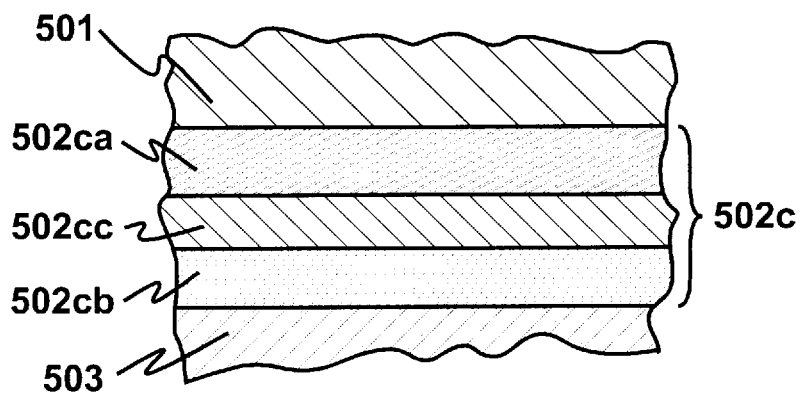
FIG. 9c illustrates a detailed cross-sectional view of a third preferred EPROM layer.

FIG. 9C illustrates a third preferred EPROM layer 502c of a 3D-EPROM memory element. In this preferred embodiment, a middle buffer layer 502cc is inserted between the quasi-conduction layer 502cb and antifuse layer 502ca. The middle buffer layer 502cc can be made of a refractory metal, e.g. W, with a thickness of 10 nm–300 nm, preferably 100 nm. During the programming of the antifuse layer 502ca, it usually involves local Joule heating and temperature at the antifuse layer 502ca rises. The addition of the middle buffer layer 502cc can prevent thermal damage to the quasi-conduction layer 502cb. The programming and read operation of this preferred embodiment is similar to those disclosed in FIGS. 9A–9B.

Figure 10A:
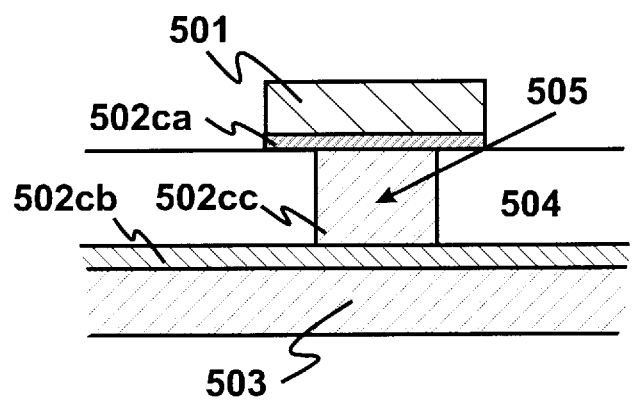
FIG. 10A is a cross-sectional view of a preferred 3D-EPROM element.
Figure 10B:
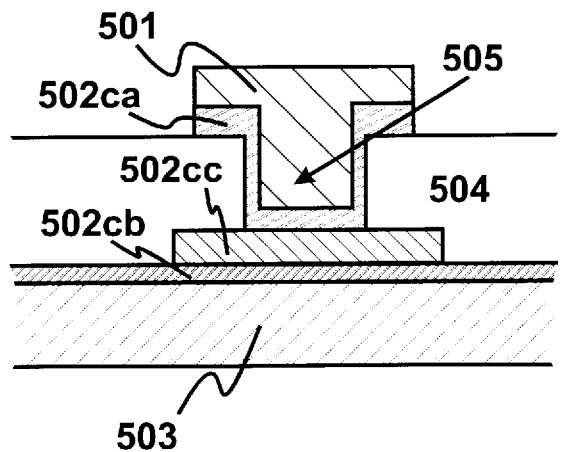
FIG. 10B is a cross-sectional view of an alternate preferred 3D-EPROM element.

The memory element of 3D-EPROM can have structures illustrated in FIGS. 6B–6E, except that the quasi-conduction layer 502b is replaced by the EPROM layer 502c. For the EPROM layer disclosed in FIG. 9C, some additional preferred memory element structures are illustrated in FIGS. 10A and 10B. It should be apparent to those skilled in the art that the position of the quasi-conduction layer 502cb and the antifuse layer 502ca are interchangeable in FIGS. 10A and 10B.

FIG. 10A illustrates a preferred 3D-EPROM memory element. It comprises a bottom electrode 503, a quasi-conduction layer 502cb, a middle buffer layer 502cc, an antifuse layer 502ca and a top electrode 501. The fabrication steps include: depositing and patterning the bottom electrode 503 and the quasi-conduction layer 502cb, depositing the field material 504; etching a via 505 therethrough to expose a portion of the quasi-conduction layer 502cb; filling the via 505 with the middle buffer layer 502cc; forming the antifuse layer 502ca and the top electrode 501.

FIG. 10B illustrates an alternate preferred 3D-EPROM memory element. The manufacturing steps of this preferred embodiment are: depositing the bottom electrode 503, the quasi-conduction layer 502cb and the middle buffer layer 502cc; masking and etching the quasi-conduction layer 502cb, the middle buffer layer 502cc; masking and etching the bottom electrode 503; depositing the field material 504; etching a via 505 to expose a portion of the middle buffer layer 502cc; depositing and patterning the antifuse layer 502ca and the top electrode 501.

Figure 12A:
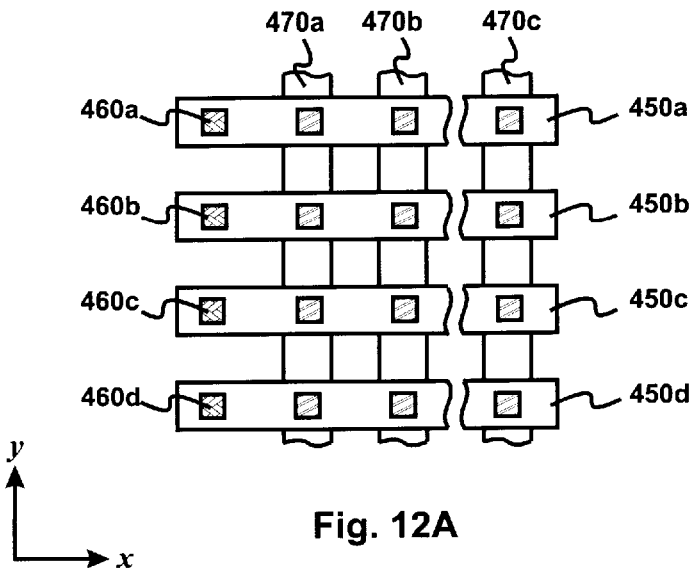
FIG. 12A is a plane view of a first preferred layout of 3D-ROM within one memory level.
Figure 12B:
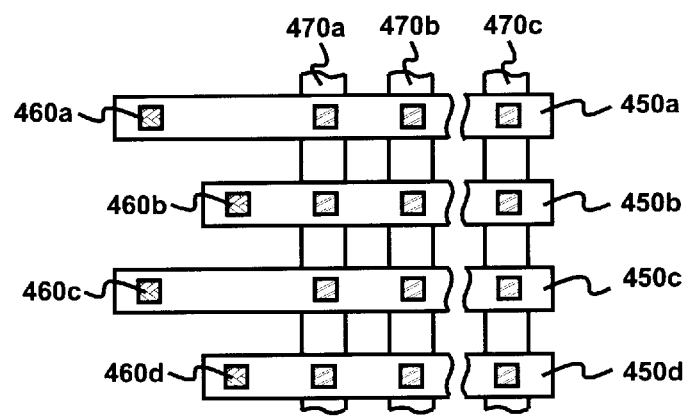
FIG. 12B is a plane view of a second preferred layout of 3D-ROM within one memory level.
Figure 12C:
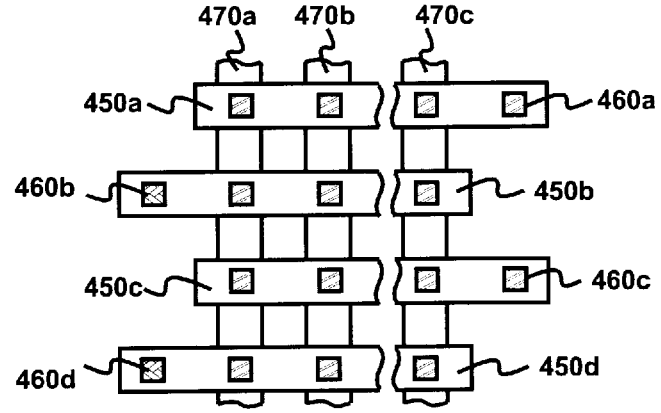
FIG. 12C is a plane view of a third preferred layout of 3D-ROM within one memory level.

FIGS. 12A–12C illustrate several preferred layout of the 3D-ROM at one memory level. In these figures, the word lines 450a–450d are along x direction, whereas the bit lines 470a–470c are along y direction. Contacts vias 460a–460d provide electrical connections between the word lines and transistors in the substrate.

FIG. 12A illustrates a first preferred layout. In this preferred embodiment, all contact vias 460a–460d fall into a single straight line. FIG. 12B illustrates a second preferred layout. In this preferred embodiment, the contact vias are divided into two groups: group A, contact vias 460a and 460c; group B, contact vias 460b and 460d. Group B contact vias are pulled back a short distance from group A contact vias. As a result, all contact vias 460a–460d fall into two straight lines. Because the contact vias are less crowed, the design of the decoders could be much easier. FIG. 12C illustrates a third preferred layout. Similarly, the contact vias are divided into two groups: group C, contact vias 460a and 460c; group D, contact vias 460b and 460d. Group C contact vias and group D contact vias are placed in the opposite ends of the word lines. Hence, the design of the decoders is much easier.

Figure 13:
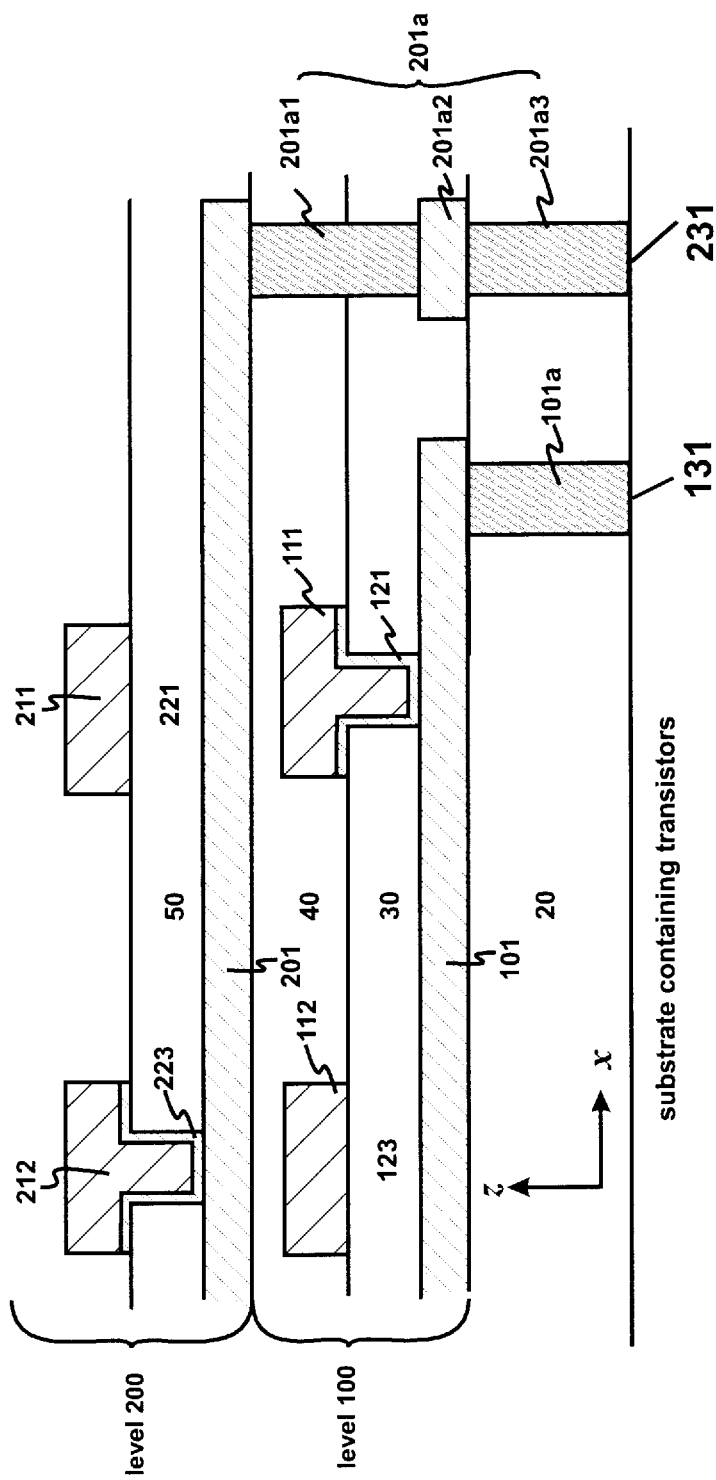
FIG. 13 illustrates a cross-sectional view of a first preferred 3D-ROM structure.

FIG. 13 illustrates a cross-sectional view of a first preferred 3D-ROM structure. In this particular figure, a 3D-MPROM structure is used as an example. The manufacturing process of this preferred embodiment is as follows. It starts with a semiconductor substrate 10 with transistors thereon. As those of ordinary skills in the art will appreciate, these transistors can be manufactured using standard semiconductor processing techniques. The function of these transistors is to provide addressing/read of a selected memory element. An insulating layer 20 is disposed on top of substrate 10. One insulating material of choice is plasma silicon oxide. Other advanced dielectric system can also be used to facilitate the gap-filling. Then the insulating layer 20 is planarized using techniques such as CMP. Thereafter contact via 101a and interlevel connecting via 201a3 are formed therethrough by means such as reactive ion etch (RIE).

A conductive layer is disposed on the planarized surface and patterned to form the first level word line 101. A landing pad 201a2 is formed at the same time. The word line 101 may comprise highly conductive metals, such as Al or Cu. Another insulating layer 30 is disposed over the word line 101 and then planarized. At this point, a photo-mask with a predetermined pattern is applied to the insulating layer 30. If the digital data is logic "0" at the site 123 and logic '2' at the site 121, it should be configured in such a way that the photo-mask is dark at the site 123 and clear at the site 121. Thus, photoresist will only be cleared at the site 121 after the photolithography step. After RIE, via is formed and a portion of the word line 101 is exposed. This is followed by the formation of the quasi-conduction layer 121 and the formation of the bit lines 111 and 112. Thereafter, another insulating layer 40 is disposed over the bit lines 111 and 112. This insulating layer 40 can be planarized using techniques such as CMP. It provides a flat foundation the second memory level 200 can be built upon. Those with ordinary skill in the art will recognize that these steps can be easily realized by the state-of-the-art semiconductor processing techniques.

The second memory level 200 can be formed in a similar manner. An additional step is required to form an interlevel connecting via 201a1 between the word line 201 at the memory level 200 to the landing pad 201a2 at the memory level 100. Thus the contact via 201a makes electrical connection between the second memory level 200 and the substrate 10. Repeating these steps, a multilevel 3D-ROM can be manufactured.

In this particular embodiment, the memory elements with a structure illustrated in FIGS. 6A and 6B are used. It is apparent to those skilled in the art that other preferred memory element structures in FIGS. 6C–6E are also feasible.

Figure 14:
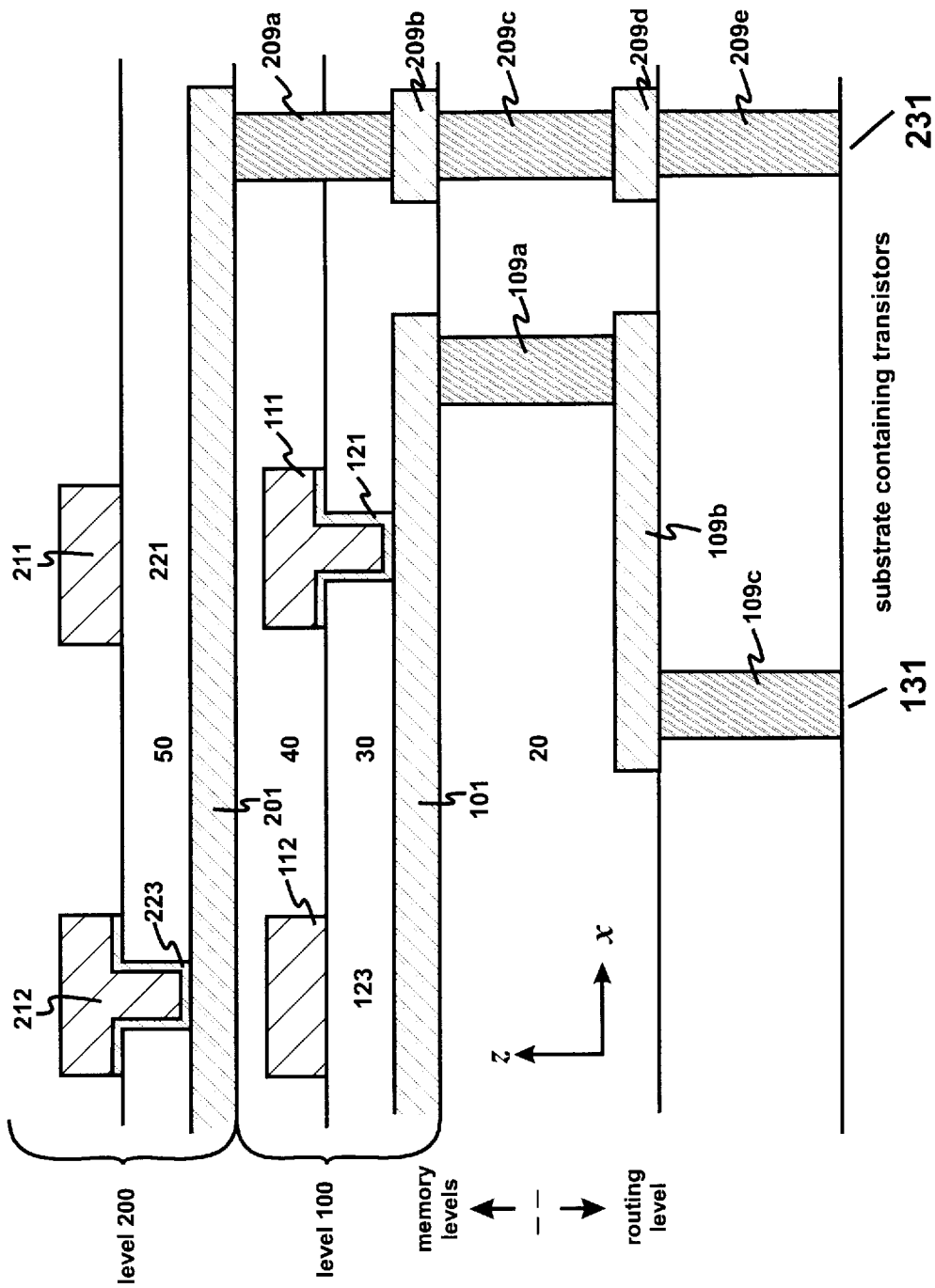
FIG. 14 illustrates a cross-sectional view of a second preferred 3D-ROM structure.

Referring now to FIG. 14, a second preferred embodiment is illustrated. A 3D-MPROM is used as an example. From FIG. 2, certain physical area is required for X-decoders as well as for Y-decoders. Accordingly, the spacing between the contact points 131 and 231 must exceed a certain value. To sustain the memory capacity of 3D-ROM, at least one routing level is added between the substrate 10 and the first memory level 100. This routing channel 109b moves the contact point 131 of the memory level 100 away from the contact point 231 of the memory level 200. Hence, more chip area can be saved and memory capacity can be further increased.

Figure 15A:
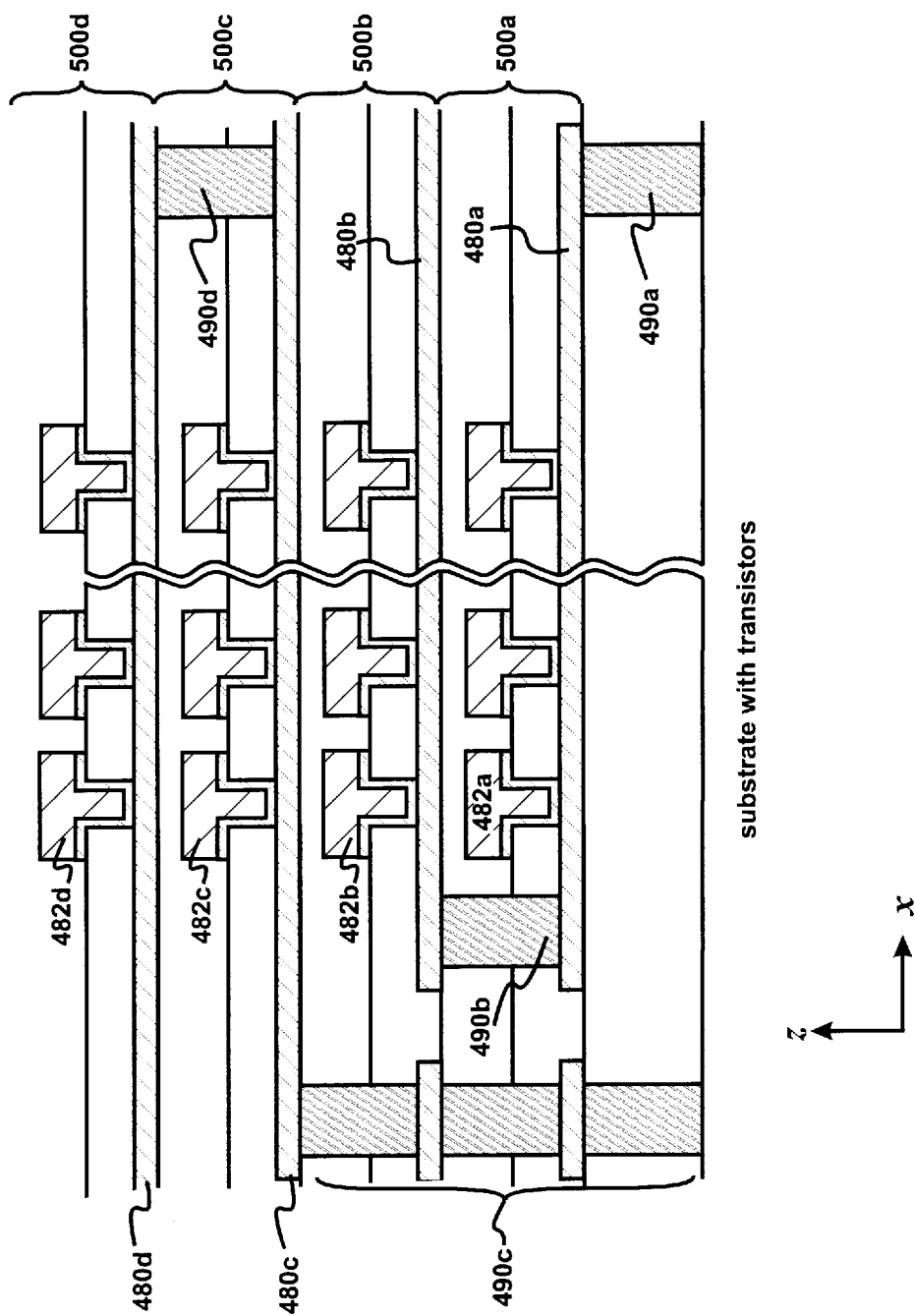
FIGS. 15A and 15B illustrate cross-sectional views of a third preferred 3D-ROM structure.
Figure 15B:
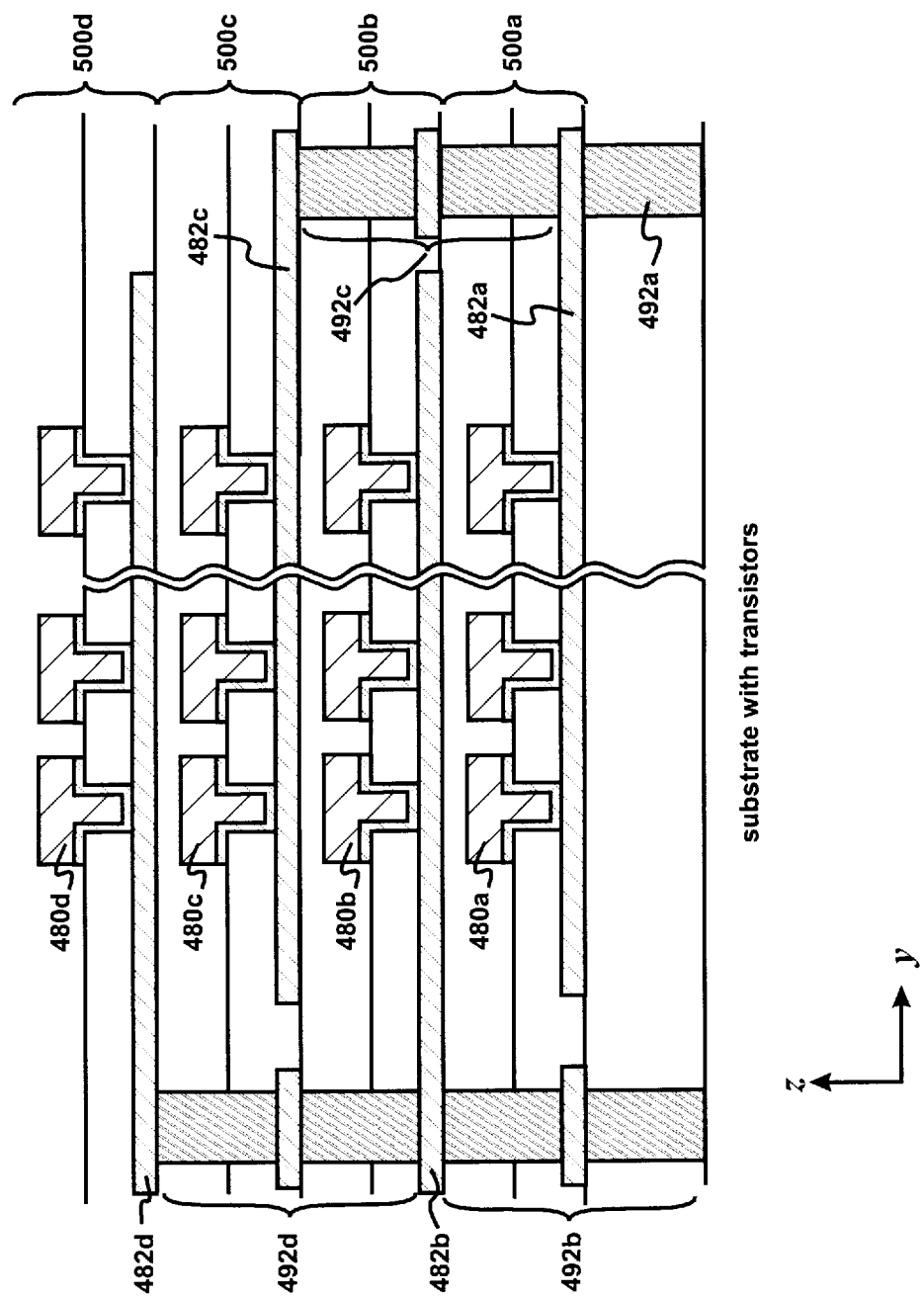

FIGS. 15A and 15B illustrate a third preferred embodiment. In this preferred embodiment, the address select lines at various levels are connected in series to reduce the total number of contact points between the address select lines and the substrate 10. Reducing the number of contact points reduces the complexity of decoders and improves the manufacturability of 3D-ROM. Using the scheme disclosed in FIGS. 13 and 14, there are l×(m+n) contact points for a l×m×n 3D-ROM. However, for a l×m×n memory, the minimum number of contact points should be $2 \cdot \sqrt{l \times m \times n}$. For example, a 4×3×3 3D-ROM can have only 6 word line contact points and 6 bit line contact points. FIGS. 15A and 15B illustrate the implementation of this scheme.

FIG. 15A illustrates a cross-sectional view perpendicular to the bit lines 482a–482d of the third preferred 3D-ROM. There are four memory levels in this specific 3D-ROM, levels 500a–500d. The word lines 480a–480d are divided into two groups: group A, word lines 480a and 480b; group B, word lines 480c and 480d. The word lines within each group is connected in series and share one contact via to the substrate 10. For example, the word line 480b is connected to the word line 480a by the metal plug 490b and then to the substrate 10 by the contact via 490a. Similarly, the word line 480d is connected to the word line 480c by the metal plug 490d and then to the substrate 10 by the contact via 490c.

FIG. 15B illustrates a cross-sectional view perpendicular to the word lines 480a–480d of the third preferred 3D-ROM. The bit lines 480a–480d are divided into two groups: group C, bit lines 482a and 482c; group D, bit lines 482b and 482d. The bit lines within each group is connected in series and share one contact via to the substrate 10. For example, the bit line 482c is connected to the bit line 482a by the metal plug 492c and then to the substrate 10 by the contact via 492a. Similarly, the bit line 482d is connected to the bit line 482b by the metal plug 492d and then to the substrate 10 by the contact via 492b. In sum, the total number of contact points to the substrate 10 is reduced by half using this scheme.

The examples given in FIGS. 13–15B are 3D-MPROM. For 3D-EPROM, similar manufacturing steps can be followed except that, vias at all memory sites should be opened and an EPROM layer comprising a quasi-conduction layer and an antifuse layer should be disposed at these vias instead of the quasi-conduction layer alone.

Finally, some applications of 3D-ROM will be discussed. With its large memory capacity, 3D-ROM can find its applications in numerous areas. Today, computer uses most of its hard-disk drive (HDD) to store softwares. These softwares are rarely changed and this is a great waste of HDD resources. Usage of CD-ROM can partly alleviate the problem, but the access time to CD-ROM is long. 3D-ROM, with its large memory capacity and fast access time, is an ideal storage device to store software programs. A computer using 3D-ROMs to store softwares will have a very relaxed requirement on HDD capacity. When used as the storage device for computer softwares, 3D-ROM can be either used in individual memory chips or even integrated on top of the CPU. Another application of 3D-ROM is smart cards, or secure cards. Smart cards can store a large amount of personal information and in the near future will replace ID, calling card, credit card, etc. In smart cards, some information needs to be permanently kept while other information may need to be updated periodically. It is possible to integrate MPROM, EPROM and other non-volatile memory such as E$^2$PROM onto a single 3D-ROM and use it for smart card applications. For example, E$^2$PROM will be manufactured on the semiconductor substrate together with decoders, then layers of MPROM and EPROM can sequentially built on top. Because of the low-cost and high integration density of MPROM and EPROM, smart cards integrating E$^2$PROM, MPROM and EPROM in 3D fashion will find its market niche in the near future.

While the invention has been particularly shown and described with reference to the preferred embodiments thereof, it will be understood by those skilled in the art that various changes in form and details may be made without departing from the spirit and scope of the invention. For example. positive logic is assumed throughout the above disclosure. It is apparent to those skilled in the art that all these structures can be used for negative logic if logic "1" and logic "0" are interchanged. The invention, therefore, is not to be limited except in the spirit of the appended claims.

What is claimed is:

1. A read-only memory element in an integrated circuit comprising:
   a first electrode, said first electrode comprising metallic materials;
   a second electrode, said second electrode comprising metallic materials;

a quasi-conduction layer separating said first electrode and said second electrode, said quasi-conduction layer being a nonlinear resistor, having a low resistance at the read voltage and having a higher resistance when the applied voltage is smaller than the read voltage.

2. The read-only memory element according to claim 1 wherein said quasi-conduction layer comprises a semiconductor material.

3. The read-only memory element according to claim 1 wherein said semiconductor material is selected from the group of C, Si, Ge, Sn, SiC, GaAs.

4. The read-only memory element according to claim 1 wherein said semiconductor material is doped.

5. The read-only memory element according to claim 1 wherein said quasi-conduction layer has a higher resistance when the polarity of the applied voltage is opposite to the polarity of the read voltage.

6. The read-only memory element according to claim 5 wherein said quasi-conduction layer further comprises a first semiconductor layer and a second semiconductor layer, said first semiconductor layer and said second semiconductor layer being opposite doped.

7. The read-only memory element according to claim 1 wherein said quasi-conduction layer has a non-single-crystalline structure.

8. The read-only memory element according to claim 1 further comprising an antifuse layer between said first electrode and said second electrode, said antifuse layer being non-conductive when said antifuse layer is unprogrammed, said antifuse layer being conductive when said antifuse layer is programmed.

9. The read-only memory element according to claim 8 further comprising a buffer layer separating said antifuse layer and said quasi-conduction layer, said buffer layer comprising metallic materials.

10. The read-only memory element according to claim 8 wherein said antifuse layer comprises amorphous silicon.

11. The read-only memory element according to claim 8 wherein said antifuse layer comprises protective ceramic materials.

12. A semiconductor integrated circuit having at least one read-only memory level stacked level by level above a semiconductor substrate with decoders thereon, each memory level comprising:

a plurality of spaced-apart memory element select lines, said select lines comprising metallic materials;

a plurality of read-only memory elements, each of said memory elements comprising first and second metallic electrodes, said first metallic electrode being coupled to a first select line, said second metallic electrode being coupled to a second select line;

an interlevel insulating layer covering said select lines and said memory elements at said memory level;

a plurality of interlevel connecting vias through said memory level, said interlevel connecting vias providing coupling means between one memory level and said semiconductor substrate.

13. The semiconductor integrated circuit according to claim 12 wherein at least one of said memory elements further includes a quasi-conduction layer separating said first electrode and said second electrode, said quasi-conduction layer being a nonlinear resistor, having a low resistance at the read voltage and having a higher resistance when the applied voltage is smaller than the read voltage.

14. The semiconductor integrated circuit according to claim 12 wherein at least one of said memory elements further include an antifuse layer separating said first electrode and said second electrode, said antifuse layer being non-conductive when said antifuse layer is unprogrammed, said antifuse layer being conductive when said antifuse layer is programmed.

15. The semiconductor integrated circuit according to claim 12 wherein:

said memory level further comprise a plurality of word lines and a plurality of first contact vias, said word lines being coupled to said semiconductor substrate through said first contact vias;

said semiconductor substrate further comprises a plurality of first contact points for said memory level, said first contact vias making contact with said semiconductor substrate at said first contact points; and said first contact points form at least one straight line.

16. The semiconductor integrated circuit according to claim 12 wherein:

said memory level further comprise a plurality of bit lines and a plurality of second contact vias, said bit lines being coupled to said semiconductor substrate through said second contact vias;

said semiconductor substrate further comprises a plurality of second contact points for said memory level, said second contact vias making contact with said semiconductor substrate at said second contact points; and said second contact points form at least one straight line.

17. The semiconductor integrated circuit according to claim 12 wherein the total number of memory levels is greater than or equal to two and said memory levels further include:

a first memory level, said first memory level including a first word line and a first bit line, said first memory level being coupled to a first decoder on said substrate;

a second memory level, said second memory level including a second word line and a second bit line, said second first memory level being coupled to a second decoder on said substrate.

18. The semiconductor integrated circuit according to claim 17 further including at least one routing level, whereby said first decoder is spaced away from said second decoder.

19. The semiconductor integrated circuit according to claim 17 wherein said first word line is connected in series with said second word line.

20. The semiconductor integrated circuit according to claim 17 wherein said first bit line is connected in series with said second bit line.

* * * * *

UNITED STATES PATENT AND TRADEMARK OFFICE
CERTIFICATE OF CORRECTION

PATENT NO. : 5,835,396
DATED : Nov. 10, 1998
INVENTOR(S) : Guobiao Zhang

It is certified that error appears in the above-identified patent and that said Letters Patent is hereby corrected as shown below:

On Column 1, line 15-16, replace "only once" with --at least once--.
On Column 3, line 50, replace "they" with --the y--.
On Column 3, line 42, after "x-y plane" insert --.--.
Column 4, line 60 - Column 5, line 14, replace all "$V_p$" with --$V_{pp}$--.
On Column 11, line 6, replace "logic '2'" with --logic '1'--.
On Column 13, line 1, replace "separating" with --between--.
On Column 14, line 1, replace "separating" with --between--.
On Column 14, line 8, replace "separating" with --between--.

Signed and Sealed this

Sixth Day of April, 1999

Attest:

Q. TODD DICKINSON

Attesting Officer

Acting Commissioner of Patents and Trademarks